(12) United States Patent
Dykes et al.

(10) Patent No.: US 6,586,069 B2
(45) Date of Patent: Jul. 1, 2003

(54) ULTRATHIN PROTECTIVE OVERCOATS COMPRISING FULLERENE FOR MAGNETIC MATERIALS

(75) Inventors: John W. Dykes, Eden Prairie, MN (US); Joel W. Hoehn, Cottage Grove, MN (US); James E. Angelo, Burnsville, MN (US); William D. Mosley, Savage, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 65 days.

(21) Appl. No.: 09/835,120

(22) Filed: Apr. 13, 2001

(65) Prior Publication Data

US 2001/0055700 A1 Dec. 27, 2001

Related U.S. Application Data

(60) Provisional application No. 60/209,012, filed on Jun. 1, 2000, and provisional application No. 60/197,228, filed on Apr. 14, 2000.

(51) Int. Cl.[7] .................................................. G11B 5/31
(52) U.S. Cl. ...................... 428/65.3; 360/122; 360/244; 428/694 TC; 428/900
(58) Field of Search ................................ 428/403, 65.3, 428/408, 694 T, 694 TP, 694 TC, 900; 360/244, 122, 135

(56) References Cited

U.S. PATENT DOCUMENTS

| | | | |
|---|---|---|---|
| 4,503,125 A | 3/1985 | Nelson et al. | 428/408 |
| 4,641,841 A | 2/1987 | Regan | 525/540 |
| 5,316,636 A | 5/1994 | Bunshah et al. | 204/157.47 |
| 5,374,463 A | 12/1994 | Bethune et al. | 428/64 |

(List continued on next page.)

FOREIGN PATENT DOCUMENTS

| | | |
|---|---|---|
| FR | 2 461 997 | 7/1980 |
| JP | 05282660 | 10/1993 |
| JP | 05314451 | 11/1993 |
| JP | 05342570 | 12/1993 |
| JP | 06044556 | 2/1994 |
| JP | 07235045 | 5/1995 |
| JP | 08212539 | 8/1996 |
| JP | 09211862 A | 8/1997 |
| JP | 09211862 | 8/1997 |
| JP | 10049885 | 2/1998 |
| JP | 11125904 | 5/1999 |

OTHER PUBLICATIONS

"Molecular Brush Assembly", IBM Technical Disclosure Bulletin, vol. 37, No. 1, pp. 261–262, Jan. 1994.

"Molecular Ball Bearing system for Magnetic Head/Disc Interface", *IBM Technical Disclosure Bulletin*, vol. 37, No. 7, Jul. 1994.

Fartash, "Growth and Microstructure of Interfacially Oriented Large–Crystalline–Grain $C_{60}$ Sheets" *Applied Physics Letters*, vol. 64, No. 14, pp. 1877–1879 Apr. 4, 1994.

(List continued on next page.)

*Primary Examiner*—H. Thi Le
(74) *Attorney, Agent, or Firm*—Westman, Champlin & Kelly, P.A.

(57) ABSTRACT

An improved magnetic medium has a metal or semiconductor surface in which the surface of the magnetic medium has an approximate monolayer of fullerene molecules bonded to the metal or semiconductor surface. The bond strength between the fullerene molecules and the surface is stronger than the fullerene-fullerene intermolecular bond strength. The magnetic media can be used in the production of components for data storage system, in particular heads with magnetic transducers and magnetic or optical-magnetic discs. In methods for forming the fullerene coatings, an approximate monolayer of fullerene molecules are deposited on a metal or semiconductor surface substantially free of contaminants.

29 Claims, 3 Drawing Sheets

U.S. PATENT DOCUMENTS

| | | | | |
|---|---|---|---|---|
| 5,447,796 | A | | 9/1995 | Tsukamoto et al. .......... 428/408 |
| 5,538,763 | A | | 7/1996 | Ueba et al. .................. 427/523 |
| 5,558,903 | A | | 9/1996 | Bhushan et al. .............. 427/11 |
| 5,744,399 | A | | 4/1998 | Rostoker et al. ............ 438/622 |
| 5,744,431 | A | | 4/1998 | Diaz et al. .................. 508/410 |
| 5,876,790 | A | | 3/1999 | Kats ........................... 427/122 |
| 5,886,854 | A | | 3/1999 | Diaz et al. ............... 360/99.08 |
| 5,985,105 | A | * | 11/1999 | Smoliar .................... 204/192.2 |
| 6,014,288 | A | * | 1/2000 | Cha et al. ................... 360/103 |
| 6,017,630 | A | | 1/2000 | Tanaka et al. .............. 428/402 |
| 6,045,596 | A | | 4/2000 | Holland, Jr. et al. ........ 324/662 |
| 6,086,949 | A | * | 7/2000 | Hwang et al. .............. 427/130 |
| 6,303,214 | B1 | * | 10/2001 | Chour et al. ................ 428/212 |
| 6,416,935 | B1 | * | 7/2002 | Hsiao et al. ................ 430/320 |
| 6,421,202 | B1 | * | 7/2002 | Tanaka et al. .............. 360/122 |
| 6,433,965 | B1 | * | 8/2002 | Gopinathan et al. ..... 360/235.4 |
| 6,479,111 | B2 | * | 11/2002 | Dykes et al. ............... 427/595 |

OTHER PUBLICATIONS

Altman et al., "Nucleation, Growth and Structure of Fullerene Films on Au(111)", *Surface Science*, No. 279, pp. 49–67, 1992.

Sellidj et al., Vibrational and Electronic Properties of Monolayer and Mulilayer $C_{60}$ Films on Rh(111), *Journal of Physical Chemistry*, vol. 97, No. 39, pp. 10076–10082, 1993.

Chen et al., "Growth of C60 Films on Silicon Surfaces", *Surface Science*, No. 318, pp. 74–82, 1994.

Tannigaki et al., "Crystal Growth of $C_{60}$ thin films on layered substrates", *Applied Physics Letters*, vol. 63, No. 17, pp. 2351–2353, Oct. 25, 1993

"The Evaluation of Carbon–60 as a Lubricant for Thin–Film Magnetic Disks" by R.D. Mitchel et al., Computer Mechanics Laboratory, Technical Report No. 92–024, Dec. 1992.

"Fullerene–Surface Interactions" by Alex V. Hamza, University of California, Lawrence Livermore National Laboratory, pp. 1–23, undated.

"Reaction and passivation of aluminum with $C_{60}$", by Alex V. Hamza et al., Surface Science 318 (1994), pp. 368–378.

* cited by examiner

ULTRATHIN PROTECTIVE OVERCOATS COMPRISING FULLERENE FOR MAGNETIC MATERIALS

CROSS REFERENCE TO RELATED APPLICATIONS

This application claims priority to copending and commonly assigned U.S. Provisional Patent Application Ser. No. 60/197,228 to Dykes et al. filed on Apr. 14, 2000, entitled "Ultrathin Protective Overcoat For Magnetic Recording Heads," incorporated herein by reference, and to copending and commonly assigned U.S. Provisional Patent Application Ser. No. 60/209,012 to Dykes et al. filed Jun. 1, 2000, entitled "Ultrathin Protective Overcoat For Magnetic Recording Media," incorporated herein by reference.

BACKGROUND OF THE INVENTION

The invention relates to protective coatings for components of disc drive data storage systems. In particular, the invention relates to protective coatings for magnetic materials used in disc drive systems used for the storage and/or retrieval of data, including, for example, magnetic read/write heads and magnetic discs.

Advances in many technologies have created enhanced demands on materials used in the production of a variety of devices. Specifically, miniaturization has decreased tolerance levels while increasing performance requirements. Furthermore, coating technology has become extremely important since coatings can be used to alter the surface properties of the composite while maintaining desirable properties of the underlying substrate. In particular, thin coatings can serve to protect the underlying substrate from a variety of assaults.

Magnetic and optical-magnetic data storage devices generally use data storage discs and magnetic heads for reading and/or writing. In use, the heads "fly" just above the disc while the disc is spinning at a rapid rate. The read/write head generally includes an air bearing surface, which faces the disc surface. As the disc rotates, the disc drags air along the air bearing surface. As the air passes along the air bearing surface, the air pressure between the disc surface and the air bearing surface creates a hydrodynamic lifting force that causes the slider or head to lift in relation to the disc surface. The hydrodynamic lift and corresponding fly height are affected by the speed of rotation of the disc, the design of the air bearing surface of the read/write head and the preload force supplied to the head by the gimbal assembly supporting the head.

Read/write heads generally use magnetic transducers to read and/or write data from a magnetic data disc. Heads with magneto-resistive elements can also be used for asperity detection to identify imperfections on the surface of a rotating disc by identifying changes in electrical resistance after the head contacts a bump or imperfection on a disc surface. If unacceptable imperfections are detected, the disc can be smoothed or discarded. Similarly, heads with magnetic transducers can be used in combination magneto-optical disc storage systems.

Disc drives for data storage can use one or more discs with a magnetizable medium for the storage of information. The magnetic medium generally is formed by a relatively thin magnetic layer on a non-magnetic substrate. Typically, the data is stored at specific locations along concentric data tracks. The disc drive assemblies for magnetic data storage include head gimbal assemblies aligned with the disc surface. The head/gimbal assemblies support transducers, such as magnetoresistive elements, for reading data from and writing data to the data tracks near the disc surface. Information is stored in the magnetic media within the data storage zones.

Intermittent contact between the head and the disc surface causes wear of the disc surface and the head. To protect the disc surface and/or the head from wear and corrosion, overcoats can be placed over the magnetic medium on the disc surface and/or the head surface. Preferred overcoats reduce wear, friction and oxidation while maintaining proper hydrodynamic interaction between the head and the disc surface during rotation and during take-off and landing. Protective overcoats also protect the head during processing and fabrication.

To obtain higher storage densities on the disc surface, fly heights between the read/write head and the disc surface are being reduced. Reducing the fly height improves the magnetic interaction between the head and the disc surface to allow correspondingly higher data storage densities. Thus, it is important that protective coatings are thin enough not to excessively increase the effective distance between the magnetic transducers of the head and the magnetic materials near the disc surface.

Carbon coatings have been used to form protective layers on substrates. The coating, however, increases the spacing between the surface and the underlying substrate. Thus, for example in the production of magnetic discs, any performance improvement resulting from a reduction in fly height can be countered by the presence of protective coatings and the like that result in an increased distance of the magnetic medium and the disc surface.

SUMMARY OF THE INVENTION

In a first aspect, the invention pertains to a disc drive data storage system comprising a magnetic material and a means for protecting the surface of the magnetic material.

In a further aspect, the invention pertains to a disc drive data storage system comprising a magnetic material having a coating surface of a material selected from the group consisting of metals, semiconductors and mixtures thereof. The coating surface has an approximate monolayer of fullerene molecules bonded to the coating surface with a bond strength greater than fullerene-fullerene intermolecular bond strength.

In another aspect, the invention pertains to a method for protecting a surface of a magnetic material in a disc drive data storage system. The method includes depositing an approximate monolayer of fullerene molecules on the surface of the magnetic material. The surface comprises a material selected from the group consisting of metals, semiconductors and combinations thereof, and the surface is substantially free of contaminants.

In an additional aspect, the invention pertains to another method for protecting a surface of a magnetic material in a disc drive data storage system. The method includes depositing fullerene molecules on a surface of the magnetic material under ultrahigh vacuum with a pressure no more than about $1 \times 10^{-7}$ torr.

DETAILED DESCRIPTION OF THE ILLUSTRATIVE EMBODIMENTS

Figure 1:
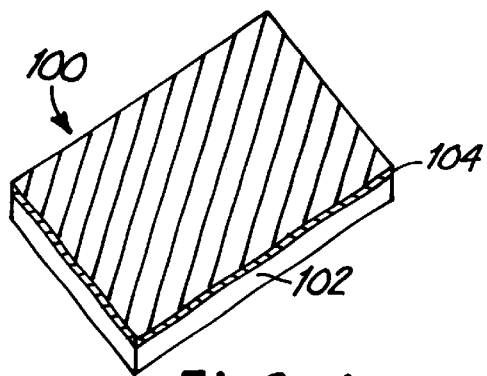
FIG. 1 is a perspective view of a substrate with a fullerene monolayer coating.

Ultrathin protective coatings can be created with roughly a monolayer of purified fullerenes on a clean metal or semiconductor substrate surface such that the fullerenes are strongly bonded to the surface. In forming the protective fullerene layer, it is important that the surface is cleaned of oxides and other contaminants since the presence of oxides and the like prevent strong bonding of the fullerenes to the surface. The improved, strongly bonded fullerene coatings are preferably applied to materials that have a magnetic material. The fullerene monolayers protect the magnetic material from corrosion due to water vapor and wear while providing satisfactory lubrication. In particular, these coating are suitable for the protection of magnetic and optical-magnetic data storage system components, in particular read/write heads and magnetic discs.

Improvements in magnetic and optical-magnetic storage technology have resulted in the shrinking of distances between moving components of the data storage systems. In particular, magnetic heads for reading and/or writing "fly" very close to rapidly spinning magnetic data discs. Due to the small distances between the head and the disc, occasional contact is made between the head and disc, either due to imperfections or fluctuations in the fly height. Protective coatings and/or lubricants are typically used to protect the magnetic materials from damage due to the contact. In addition, the protective coatings are selected to inhibit corrosion of the substrate surface, especially due to water vapor driven oxidation and to resist other chemical assaults.

To improve data storage and to increase data densities, the thickness of protective coatings for magnetic material is preferably as small as possible. The monolayer fullerene coatings described herein are very thin, yet are durable and stable. Fullerenes are carbon cage molecules characterized by five and six sided rings along the surface of the molecule. Well known fullerenes include $C_{60}$ (buckminsterfullerene). Preferred fullerene coatings include an approximate monolayer of fullerene with a thickness in the range of about 5 angstroms to about 10 angstroms (about 0.5 nanometer to about 1 nanometer).

Even though the monolayer fullerene coatings are extremely thin, a strong bond forms between the fullerenes and a clean metal or semiconductor substrate such that the coating provides durable protection. Proper cleaning of the substrate surface to remove any oxides provides for the strong bonding to the surface. The chemical activity of the fullerenes with respect to metals and semiconductors results in strong bonding to the substrate surfaces. Since fullerenes are inherently chemically stable and inert generally, the resulting coating is stable. Furthermore, the fullerenes are hydrophobic so that they prevent water vapor from contacting the underlying material and, thereby, provide excellent resistance to corrosion.

To have desired degrees of bonding with the metal/semiconductor substrate, the substrate can be cleaned prior to depositing the fullerenes. In alternative embodiments, a metal/semiconductor surface is formed prior to deposition of the fullerenes such that the surface remains clean of oxides and other impurities prior to the fullerene deposition. Furthermore, the fullerenes should be deposited in extremely pure form, for example by sublimation of the fullerenes from a purified powder of fullerenes. In particular, it is important to ensure that oxygen, for example as $O_2$ or water vapor, is not present during the deposition since oxidation of the metal/silicon substrate of can inhibit the strong binding to the substrate surface. Preferred deposition approaches are described fully below.

Since the substrate surface must be clean and free of oxides, the substrate preferably is cleaned in a vacuum chamber or other controlled environment free of contaminants, oxygen and water vapor. Alternatively, the substrate surface is formed within a controlled environment such that the surface is formed free of oxides and other impurities. Subsequent to forming the impurity free surface, the approximate monolayer of fullerenes is deposited, preferably without removing the substrate from the controlled environment. It is particularly preferred to perform the processing under an ultrahigh vacuum at pressures no more than about $1 \times 10^{-9}$ torr. Once the substrates are coated with the fullerene monolayer, the coated substrate can be removed from the controlled environment with the coating protecting the substrate surface from oxidation and other assaults.

The fullerene monolayers are preferably applied to a magnetic material forming a magnetic surface on a component of a disc drive data storage system. The magnetic surface can be a surface or a portion thereof of a magnetic head. For example, the magnetic surface can be a surface of a transducer at the air bearing surface of a head, especially a read/write head. In addition, the magnetic surface can be a surface or a portion thereof of a data storage disc for a magnetic or optical magnetic data storage system.

Heads and Media for Magnetic Data Storage Systems

The coated materials preferably include a substrate with a metal or semiconductor surface and a strongly bonded monolayer of fullerene directly onto the metal or semiconductor surface. Suitable semiconductor materials include, for example, silicon. Preferred metals include, for example, magnetic metals and alloys. Preferably, there are no oxides or other impurities disrupting the strong bonding of the fullerenes. If the substrate does not include an appropriate surface composition for the formation of strong fullerene— surface bonds, a thin adhesion layer of metal or semiconductor, such as silicon, can be added to the surface of the substrate to provide for strong bonding of the fullerenes to the adhesion layer. In preferred embodiments, the substrates include magnetic materials suitable for magnetic data storage purposes. Generally, magnetic materials are sensitive to corrosion, especially from water vapor, such that a passivation/protective coating is desirable.

Magnetic materials used in read/write heads and magnetic or optical-magnetic data storage discs are of particular interest due to their strict performance tolerances. In particular, fly heights separating a read/write head and a rotating disc surface are gradually being reduced. Due to the reduction of design tolerances, any approach to reduce the distances between the magnetic materials within the data storage system is useful with respect to increasing data density. Thus, effective passivation coatings with reduced thicknesses are highly desirable.

Figure 2:
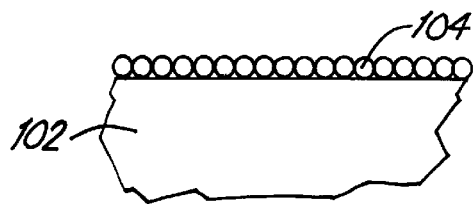
FIG. 2 is a schematic, sectional side view of a substrate with a fullerene monolayer coating.
Figure 3:
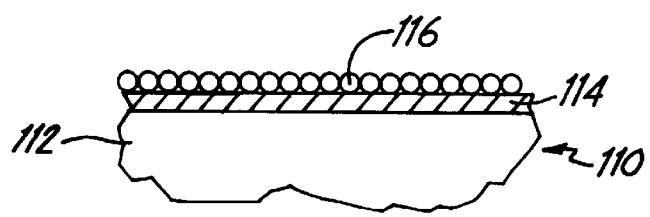
FIG. 3 is a schematic, sectional side view of a substrate with an adhesion layer and a fullerene monolayer coating.

Referring to FIG. 1, coated material 100 includes a substrate 102 and a fullerene coating 104. Substrate 102 is preferably formed from metal or semiconductor, such that a strong bond forms between the substrate and the fullerene. In preferred embodiments, substrate 102 includes magnetic materials at its surface. The magnetic materials at the surface can be immediately on the surface or near the surface below one or more thin coating layers, such as an adhesion layer. Referring to a schematic side view in FIG. 2, fullerene coating 104 is preferably an approximate monolayer of fullerene. In an alternative embodiment shown in FIG. 3, coated material 110 includes a substrate 112, an adhesion layer 114 and a fullerene coating 116. Adhesion layer 114 preferably is a metal or semiconductor material which forms a strong bond with a fullerene monolayer and the underlying substrate.

The coated substrates are particularly useful in the production of components for data storage devices. In particular, the fullerene coatings can be used to coat magnetic read/write heads, data storage discs and portions thereof. Similarly, the fullerene protective coatings can be used to coat asperity detection heads with magnetoresistive elements and components of optical-magnetic data storage systems.

In some embodiments, the fullerene coatings are applied to magnetic materials. Various magnetic materials can be used for disc drive data storage applications and are continuously being improved. The magnetic material can be a metal or alloy. Trace impurities throughout the material may be present as along as they do not significantly alter the bonding properties of the metal, especially at its surface.

The selection of a magnetic material also depends on the specific use and performance parameters. For magnetic heads, suitable ferromagnetic materials include, for example, Ni, Co, NiFe, CoFe, CoZrNb, NiFeCr, AlSiFe, NiFeRe, combinations thereof and alloys thereof. For magnetic disc, suitable magnetic materials include metals, such as cobalt and cobalt alloys, e.g., Co—Ni, Co—Cr, Co—Ni—Fe, Co—Ni—Cr, Co—Pt, Co—Ni—Pt, Co—Cr—Ta, Co—Cr—Pt, Co—Cr—Ni—B, Co—P, Co—Ni—P, other similar materials, combinations thereof and alloys thereof. Other metals and alloys used in read/write heads include, for example, PtMn, Cu, Ru, Rh, Ta, CoPt, CoCuPt, Au, and the like.

Optical-magnetic discs can include a magnetic layer with one or more layers of ferromagnetic alloy. For these applications, preferred ferromagnetic alloys are formed from one or more rare earth elements and one or more transition metals. Examples of suitable ferromagnetic alloys include, for example, TbFeCo, GdFeCo, TbFeCoZr, DyFeCo, and GdDyFeCo. The particular composition of the alloy is selected to obtain a desired Curie temperature and magnetic coercivity.

In some embodiments, the ferromagnetic alloy has a Curie temperature that can be reached by shining a relatively intense laser beam at a spot on the ferromagnetic alloy. Similarly, the Curie temperature should be significantly higher than the operating temperature of the disc drive such that thermal effects do not result in data loss. Reasonable ranges for the Curie temperature are from about 250° C. to about 350° C., and preferably near 300° C.

Figure 4:
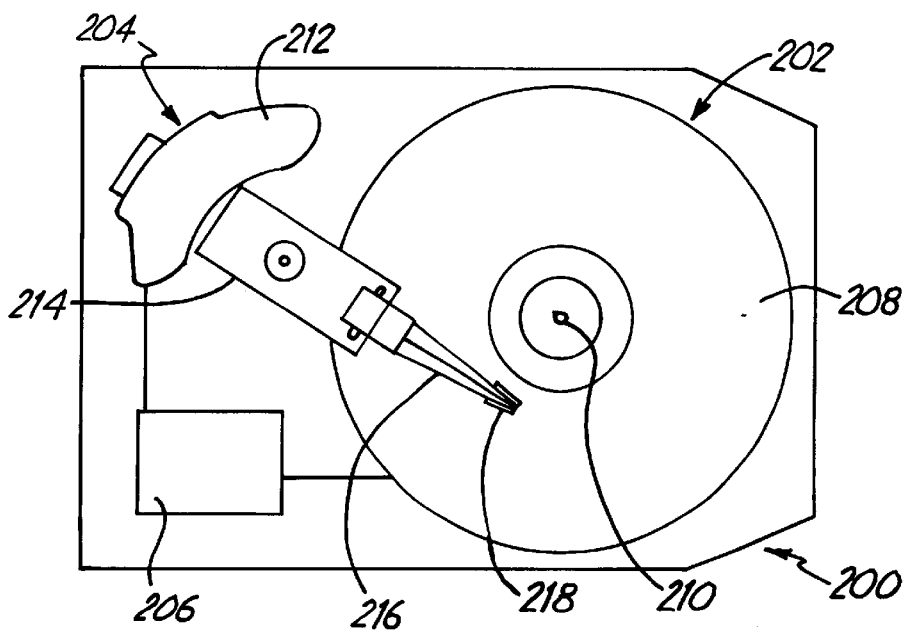
FIG. 4 is a schematic, top view of a disc drive system.

FIG. 4 depicts an embodiment of a disc drive system 200 including drive unit 202, actuator assembly 204 and controller 206. Drive unit 202 includes disc 208 and spindle 210 connected to a spindle motor. In the embodiment shown, actuator assembly 204 includes actuator 212, support arm 214, load beam 216 and gimble/head assembly 218. Actuator 212 controls the position of gimble/head assembly 218 over disc 208 by rotating or laterally moving support arm 214. Load beam 216 is located at the end of support arm 214 and gimble/head assembly 218 is located at the end of load beam 216. Controller 206 instructs actuator 212 regarding the position of support arm 214 over disc 208 and drive unit 202 regarding the control of the spindle motor.

In preferred embodiments, the fullerene coating is applied to a surface or portion thereof of head 218 and or disc 208. Head 218 can be, for example, a read head, a read/write head or a glide head for asperity detection. A variety of designs have been used and are continuously being developed for data storage heads and their corresponding magnetic transducers. The fullerene coatings described herein can be used on these heads generally independent of the precise head design.

Figure 5:
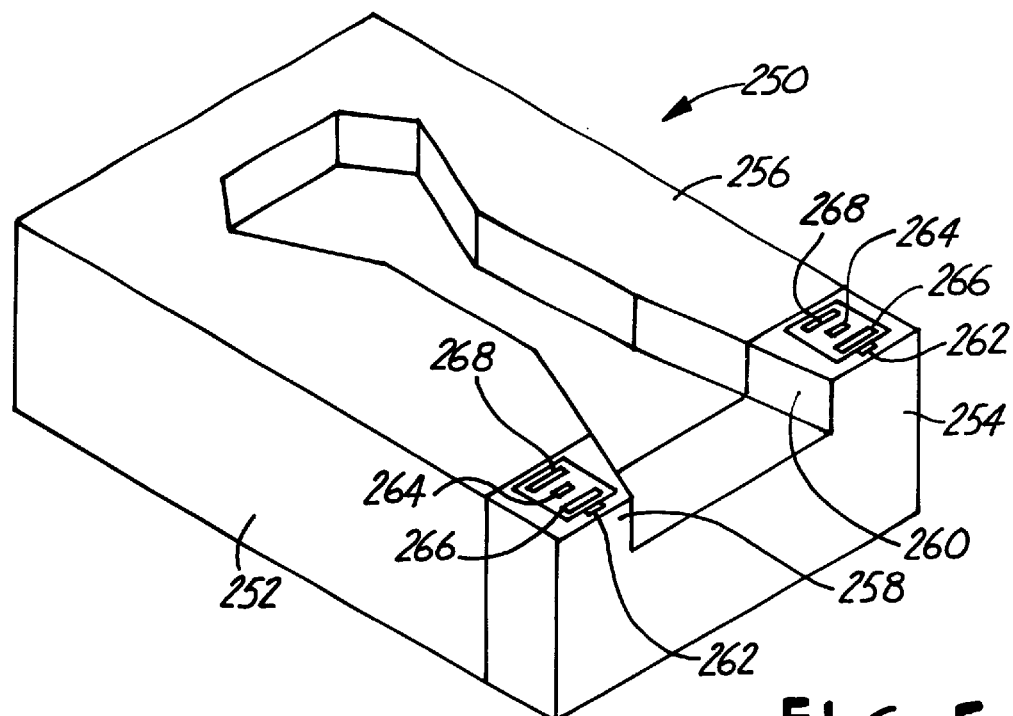
FIG. 5 is a schematic perspective view of a magnetic write head with a fullerene monolayer coating.

An embodiment of a read/write head is shown in FIG. 5. Head 250 includes a slider body 252 and a trailing edge structure 254. The transducers are generally located within trailing edge structure 254. One surface of head 250 is the air bearing surface 256 which is placed adjacent the data storage disc within the disc drive data storage unit. Air bearing surface 256 generally is contoured with rails and the like to provide desired aerodynamic performance when the head is flying adjacent the rapidly spinning disc surface.

In the embodiment shown in FIG. 5, the head includes a plurality of magnetic transducers placed on air bearing surface 256 along two rails 258, 260 within trailing edge structure 254. Specifically, each rail 258, 260 includes a write transducer 262, a read transducer 264, a shared pole 266 and a lower magnetoresistive shield 268. Generally, magnetic transducers 262, 264, 266, 268 are formed from magnetoresistive metals, such as cobalt and cobalt alloys. Magnetic transducers 262, 264, 266, 268 are placed on the air bearing surface near the trailing edge such that they fly close to the disc surface in use.

In conventional heads, the air bearing surface is covered by a protective coating, such as diamond-like carbon. Diamond-like carbon coating generally have a thickness on the order of 20–50 angstroms (2–5 nanometers). As an alternative to the diamond-like coating, the fullerene coatings described herein can be placed over the entire air bearing surface or a portion thereof. In particular, monolayer fullerene coatings form a strong bond to the metals of the magnetic material of transducers 262, 264, 266 and 268. The fullerene monolayer can be placed over the entire air bearing surface, only over the transducer surface or other portions of the air bearing surface. The air bearing surface away from the transducers can be supplied with an adhesion layer to facilitate bonding with fullerenes. Suitable adhesion layers for the air bearing surface include thin layers of silicon, which can have a thickness of about 10 angstroms to about 15 angstroms.

Figure 6:
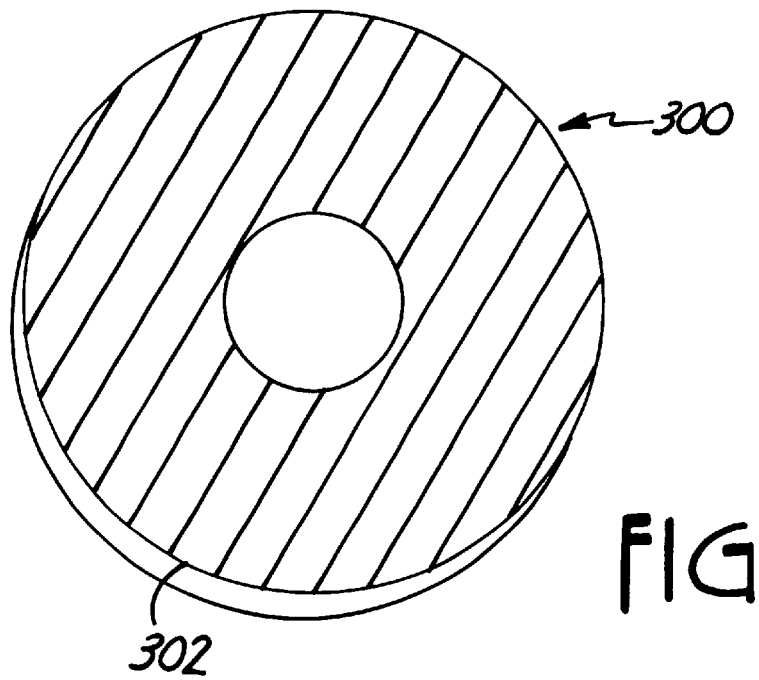
FIG. 6 is a perspective view of a magnetic storage disc with a fullerene monolayer coating.
Figure 7:
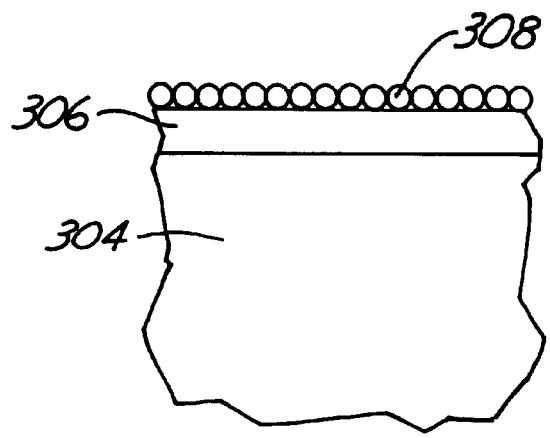
FIG. 7 is a fragmentary side view of a magnetic storage disc with a fullerene monolayer coating.

In other preferred embodiments, magnetic storage discs or optical-magnetic discs are supplied with a fullerene coating. Referring to FIG. 6, disc 300 includes a fullerene coating 302. A variety of data storage disc structures are consistent with the use a fullerene coating described herein. In one embodiment shown in FIG. 7, a base substrate 304 has a magnetic layer 306, which can include magnetic materials described above. In preferred embodiments, a monolayer of fullerene 308 is placed over magnetic layer 306. The fullerene monolayer can replace a protective coating layer and/or a lubricant layer.

Figure 8:
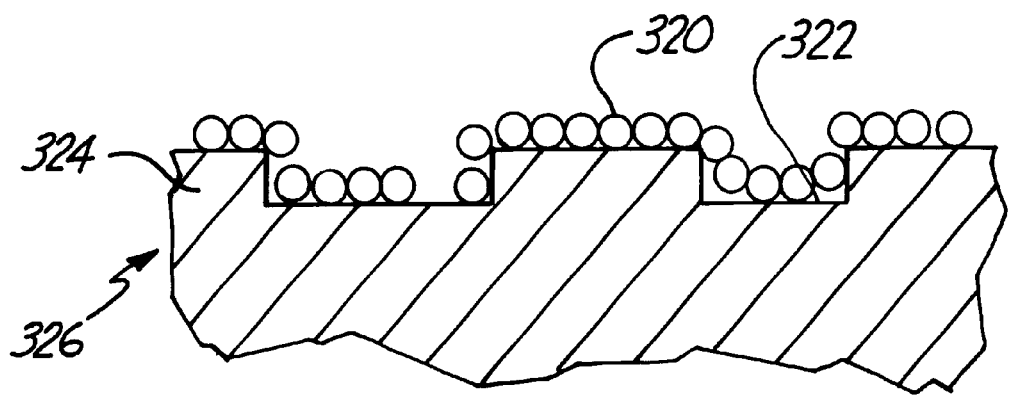
FIG. 8 is a fragmentary side view of a patterned magnetic storage disc with a fullerene monolayer coating.

The fullerene monolayer should conform the topographies of the disc surface including sharp topographies, as shown in FIG. 8. Specifically, the fullerene monolayers should conform to patterned media. Referring to FIG. 8, fullerene monolayer 320 is located on patterned surface 322 of magnetic material 324 on disc 326.

The surface of a data storage disc can optionally further include a lubricant layer over the fullerene protective layer. Suitable lubricant layers include polymer, for example, fluorinated polymers, such as perfluoropolyethers and derivatives thereof. Suitable perfluoropolyethers polymers include, for example, Fomblin® Z-60 (average molecular weight (AMW)=about 60,000 atomic mass units (AMU) or Daltons), Fomblin® Z-25 (AMW=about 25,000 AMU) and Fomblin® Z-15 (AMW=about 15,000 AMU). The Fomblin® perfluoropolyethers made by Montedison (Ausimont) S.P.A., Milan, Italy have molecular formulas of $CF_3O(CF_2CF_2O)_n(CF_2O)_mCF_3$, where n and m vary to yield particular products with average molecular weights of specified values.

In particularly preferred embodiments, both the head surface and the disc surface have a fullerene monolayer. Due to the weak interactions between fullerene molecules, the fullerene coated head should not stick strongly to the fullerene coated disc. For these embodiments in particular, a lubricant layer on the disc surface should not be needed to obtain desired tribologic performance.

Properties of Fullerene Coatings

Strong bonding between approximate fullerene monolayers and metal or semiconductor surfaces can be exploited in the formation of the improved coatings described herein. It is important in the formation of these improved fullerene monolayers be formed on an extremely clean surface since impurities can destroy the strong level of bonding between the fullerenes and the metal/semiconductor material. The desired coatings have very strong adhesion to the underlying metal/semiconductor, resist corrosion and provide reasonable tribologic properties.

Fullerenes are carbon cluster molecules with an open cage structure. The carbon atoms form five and six sided polygons on the surface of the molecules reminiscent of a soccer ball. The most well studied fullerene is $C_{60}$, buckminsterfullerene. Other known fullerenes include, for example, $C_{70}$, $C_{80}$, and $C_{84}$. Fullerenes generally, including the above fullerenes and combinations thereof, are generally useful to form coatings described herein.

Fullerene molecules form stronger bonds to metal or semiconductor surfaces than they form to other fullerene molecules. Thus, it is preferred to form the fullerene coatings with approximately one monolayer of fullerenes. If somewhat less than a monolayer is applied to the coating, the properties of the coating should not significantly affected, although if the coating is significantly less than a monolayer portions of the surface may be susceptible to corrosion and abrasion. Similarly, small amounts of fullerenes above a monolayer should not affect performance, although significant amounts more than a monolayer will unnecessarily increase the distance to the head and correspondingly decrease the magnetic signal.

In general herein, an approximate monolayer of fullerene is intended to include fullerene coatings with performance properties approximating the properties of a monolayer. A monolayer of fullerene molecules generally packs into a 2-dimensional crystal structure on the surface. A monolayer has everywhere a single fullerene molecule thickness. Of course, a fullerene coating with minor lattice defects in the monolayer may not alter the desirable properties of the fullerene layer and would be considered an approximate monolayer. The formation of strong bonds between metal/semiconductor substrates and fullerene monolayers is described further in Hamza et al., "Reaction and passivation of aluminum with $C_{60}$," Surface Science, 318, pp 368–378 (1994), incorporated herein by reference.

Since fullerene does not bond strongly to electrical insulators, oxidation of the metal or semiconductor surface greatly reduces the bonding strength and correspondingly dramatically reduces the effectiveness of the fullerene coating. Since bare metal surfaces are very susceptible to oxidation, appropriate efforts are required to prepare the clean surface free of any oxidized material prior to addition of the fullerenes. This is discussed further below. Other impurities can similarly destroy the strength of the bonding between the fullerene monolayers and the metal/semiconductor substrates.

Previous attempts to form fullerene coatings as protective layers for components of magnetic disc drives have failed to take advantage of the strong bonding between fullerene and metal/semiconductor substrates. In particular, if the surface of the substrate has oxidized even to a relatively small degree, the electrically insulating properties of the surface prevents strong fullerene bonding. While small amounts of surface oxidation may not affect magnetic properties, such surface oxidation can significantly affects bonding to the fullerenes.

In particular, U.S. Pat. No. 5,374,463 (hereinafter the '463 patent) to Buthune et al., entitled "Magnetic Recording Disk Having a Contiguous Fullerene Film And a Protective Overcoat," incorporated herein by reference, describes the deposition of fullerenes on a magnetic material. As described in the '463 patent, disc surfaces, which were not cleaned prior to fullerene deposition, did not have desired strong binding to the surface. Specifically, thicker fullerene layers had better wear resistance than thinner layers. This is inconsistent with fullerene having stronger bonding to the metal/semiconductor substrate than to other fullerene molecules. The explanation for this observation is that the disc surface had impurities, such as oxidation.

Thus, in preferred embodiments of the present invention, a structure is formed with a clean metal/semiconductor surface strongly bonded to a fullerene coating with approximately a monolayer of fullerene. Due to the absence of inhibiting impurities in these embodiments, direct fullerene to metal/semiconductor bonds can be formed, which appear to be analogous to metal-ligand bonds. Thus, strong bonding is achieved with the fullerene molecules that exceeds the strength of fullerene-fullerene bonding.

The strength of fullerene bonding to a surface (or adjacent fullerenes in multilayer fullerene coatings) can be estimated by the temperature at which the fullerenes desorb from the surface. The desorption temperature is related to the bond strength between the fullerenes molecules and surface. If the bond strength is greater, the desorption temperature is greater. For some surfaces, the surface and the fullerenes may react at a temperature lower than the desorption temperature. This reaction temperature then provides a lower limit on the bond strength.

For multilayer fullerene molecules on a surface, the fullerene desorption temperature, indicative of the fullerene-fullerene intermolecular bond strength, is between 500 K and 570 K. Thus, fullerene—surface interaction stronger than fullerene-fullerene interactions will yield a fullerene desorption temperature higher than 570 K. In preferred embodiments, the fullerene desorption temperature from the monolayer is preferably at least 625 K, more preferably at least 700 K and even more preferably at least about 725 K. The fullerene—metal/semiconductor bonding strength can be at least about 35 kilocalories/mole (kcal/mol), at least about 40 kcal/mol and even at least about 44 kcal/mol. The stability of a fullerene coating is generally very nonlinear with respect to the numerical value of bond strength (desorption temperature) such that, for example, an approximate 10%–30% increase in bond strength in kcal/mol can lead to significantly increased coating stability.

The high strength of the fullerene to metal/semiconductor bonding leads to a durable and stable protective coating. Fullerenes are hydrophobic such that the fullerene monolayer is effective to isolate the underlying metal, such as a magnetic metal/alloy, from the assaults of water vapor. By isolating water vapor from the substrate, the surface is protected from oxidation. Fullerenes are also chemically inert with respect to many common compounds. Thus, the fullerene monolayer also protects the substrate from other contaminants.

Carbon materials have long been used as surface coatings in magnetic disc drives for their protective ability while similarly improving the tribologic properties of the disc-head interface. Various carbon materials have been known to provide desirable lubricating properties. While thin polymer layers can be placed over the fullerene layers as lubricants, the fullerene monolayer itself should provide sufficient lubricating properties that no further coating is needed. Thus, a strongly bonded fullerene monolayer provides excellent protective and lubricating properties while only adding about 5 angstroms to about 10 angstroms (about 0.5 nm to about 1.0 nm) of thickness.

Methods For Depositing Preferred Fullerene Coatings

In preferred embodiments, the fullerene monolayer coatings are strongly bonded to a metal/semiconductor surface. To enable the formation of the strong fullerene—surface bonds, the surface generally is essentially free of impurities. To ensure that the surface is free of impurities, the fullerene coating generally is performed within a controlled environment. Similarly, the clean substrate surface can be formed by cleaning the substrate within the controlled environment or by forming the substrate surface within the controlled environment.

The controlled environment can be supplied, for example, by a vacuum chamber, preferably an ultrahigh vacuum chamber, or an alternative air-tight chamber. In a vacuum chamber, gaseous impurities are eliminated by operating at low pressures maintained by a pump. In other air-tight chambers, gaseous impurities can be eliminated by replacing the gas in the chamber with suitable inert gas, such as argon. In particular, the gas in the controlled environment preferably is substantially free of water vapor and $O_2$. Suitable chambers are available commercially for adaptation to the present processes.

With respect to surface preparation, at least the last surface preparation step generally should be performed in the controlled environment in which the fullerene deposition will be performed. Then, the surface can be properly prepared for fullerene bonding as an uncontaminated surface. The final surface preparation step prior to fullerene deposition can be a surface cleaning or a surface deposition.

Surface cleaning generally would involve removal of a fine layer of material such that any oxides, other surface modifications and other surface contaminants are removed. In particular, surface cleaning can be performed by, for example, $Ar^+$ sputtering at about 0.1 to about 10 keV or electron bombardment. The substrate can be annealed by heating the substrate following cleaning to help ensure a smooth uniform surface. In addition, a polishing step can be performed to clean the surface. However, if polishing is performed, any polishing compositions should be selected such that the polish itself does not introduce inappropriate contamination. For example, ceramic particles without a solvent or with a nonaqueous solvent may be suitable polishing compositions.

As an alternative to surface cleaning, the surface can be prepared within the controlled environment. In these embodiments, at least a final deposition step is performed in the controlled environment to deposit the final surface material free of contaminants. If desired, a plurality of surface preparation steps can be performed within the same controlled environment prior to fullerene deposition. For example, the entire fabrication of the tailing edge structure (254 of FIG. 5) can be performed in the controlled environment. In addition, the contouring of the air bearing surface and/or one or more lapping procedures can be performed in the controlled environment.

If an adhesion layer is applied, this adhesion layer functions as the substrate surface. Thus, the application of an adhesion layer can be a structural consideration as well as a processing issue. Specifically, if an adhesion layer is used, it can be cleaned prior to fullerene deposition, or the adhesion layer can be deposited within the controlled environment. In other words, an adhesion layer is processed equivalently to any other surface layer of the structure. In some embodiments, an adhesion layer is applied to a portion of the substrate. For example, an adhesion layer can be added to an air bearing surface of a head, such that the fullerenes will bond strongly to the entire air bearing surface and not just the transducers.

Fullerenes are commercially available from SES Research, Houston, Tex. Alternatively, there are well known ways of synthesizing fullerenes. For example, arc heating of graphite in an inert atmosphere, such as 150 torr He, results in carbon clusters from which fullerenes can be extracted with hot toluene. Fullerenes can be further purified by column chromatography of organic dispersions of fullerenes, such as with silica or alumina columns, to produce purified fullerenes.

Suitable vacuum chambers include ultrahigh vacuum chambers operating at pressures of no more than about $1 \times 10^{-7}$ torr are preferred. In some embodiments, the vacuum chambers operate at pressures less than about $1 \times 10^{-8}$ torr and in some embodiments less than about $1 \times 10^{-10}$ torr. At these low pressures, gaseous contaminants, such as water and $O_2$, are not present in sufficient amounts to contaminate surfaces. Thus, the surface steps to prepare the metal/semiconductor surface can be performed without risk of recontamination from gaseous contaminants.

In some embodiments, the fullerenes are deposited by sublimation. Heating fullerenes under low pressures, preferably less than about $1 \times 10^{-6}$ torr, to temperatures greater than about 450° C. results in sublimation of the fullerenes from a powder of fullerenes. The preferred sublimation temperatures preferably range from about 450° C. to about 550° C. If surface is clean and the atmosphere is inert, sublimation of the fullerenes does not need to be performed at low pressures, but the sublimation temperatures may be somewhat higher. The fullerene powders can be heated first to lower temperatures, preferably about 200° C. to about 350° C., to remove any residual solvent and other impurities. The substrate can be protected from the fullerene materials until it is heated to the fullerene sublimation temperatures. Preferably, the sublimation of fullerenes is preformed under ultrahigh vacuum with a pressure less than about $1 \times 10^{-8}$ torr.

To perform the coating with sublimed fullerenes, the heated fullerenes can be placed in a porous container or a tube. The substrate surface can then be placed to receive the fullerene vapors from the sublimation container. If the substrate surface is at a temperature below the sublimation temperature of the fullerenes, the fullerenes condense onto the substrate surface and form the desired bonds to the surface. If necessary, the substrate can be swept past the fullerene source at an appropriate rate. The deposition times and geometries can be empirically adjusted to yield the desired monolayer of fullerenes on the substrate surface.

Since the fullerenes strongly bond to the clean metal/semiconductor surface, any excess fullerenes beyond a monolayer can be selectively removed by heating the material after depositing the fullerenes. Specifically, the material is heated sufficiently to break the fullerene-fullerene bonds without disrupting the fullerene monolayer. The desorption of excess fullerenes beyond a monolayer generally involves heating at a temperature from about 225° C. to about 300° C.

Once the coatings are completed, the substrates can be removed from the controlled environment. The fullerene coatings themselves protect the surfaces from subsequent assaults. Then, the components containing the coated substrates can be assembled or otherwise processed into the completed disc drive data storage system products.

Although the present invention has been described with reference to preferred embodiments, workers skilled in the art will recognize that changes may be made in form and detail without departing from the spirit and scope of the invention.

What is claimed is:

1. A disc drive data storage system comprising a magnetic material having a coating surface of a material selected from the group consisting of metals, semiconductors and mixtures thereof, wherein the coating surface has an approximate monolayer of fullerene molecules bonded to the coating surface with a bond strength greater than fullerene—fullerene intermolecular bond strength.

2. The disc drive data storage system of claim 1 wherein the magnetic material comprises cobalt metal or a cobalt alloy.

3. The disc drive data storage system of claim 1 wherein the magnetic material comprises a metal composition selected from the group consisting of Co—Ni, Co—Cr, Co—Ni—Cr, Co—Pt, Co—Ni—Pt, Co—Cr—Ta, Co—Cr—Pt, Co—Cr—Ni—B, Co—P, Co—Ni—P, mixtures thereof, and alloys thereof.

4. The disc drive data storage system of claim 1 wherein the fullerene molecules are bonded to the coating surface with a bond strength corresponding to a fullerene desorption temperature from the monolayer of at least about 700K.

5. The disc drive data storage system of claim 1 wherein the fullerene comprises $C_{60}$.

6. The disc drive data storage system of claim 1 comprising a head and wherein the magnetic material is located at a surface of the head.

7. The disc drive data storage system of claim 6 wherein the magnetic material forms a transducer and wherein the magnetic material comprises cobalt or a cobalt alloy.

8. The disc drive data storage system of claim 6 wherein fullerene molecules are bonded over the entire air bearing surface of the head.

9. The disc drive data storage system of claim 6 wherein fullerene molecules are only bonded to the magnetic material along the air bearing surface.

10. The disc drive data storage system of claim 1 comprising a magnetic disc and wherein the magnetic material is located at a surface of the magnetic disc.

11. The disc drive data storage system of claim 10 wherein the disc surface is patterned.

12. The disc drive data storage system of claim 10 wherein the approximate monolayer of fullerene covers a portion of the disc surface.

13. The disc drive data storage system of claim 1 comprising a head and a magnetic disc, wherein the magnetic material is located at a surface of the head and wherein a second magnetic material is located at a surface of the magnetic disc.

14. The disc drive data storage system of claim 13 wherein the surface of the magnetic disc does not have a lubricant.

15. The disc drive data storage system of claim 1, wherein the coating surface is substantially free of oxides.

16. An article of manufacture selected from the group consisting of transducing heads and storage discs comprising a magnetic material having a coating surface of a material selected from the group consisting of metals, semiconductors and mixtures thereof, wherein the coating surface has an approximate monolayer of fullerene molecules bonded to the coating surface with a bond strength greater than fullerene—fullerene intermolecular bond strength.

17. The article of claim 16, wherein the magnetic material comprises cobalt metal or a cobalt alloy.

18. The article of claim 16, wherein the magnetic material comprises a metal composition selected from the group consisting of Co—Ni, Co—Cr, Co—Ni—Cr, Co—Pt, Co—Ni—Pt, Co—Cr—Ta, Co—Cr—Pt, Co—Cr—Ni—B, Co—P, Co—Ni—P, mixtures thereof, and alloys thereof.

19. The article of claim 16, wherein the fullerene molecules are bonded to the coating surface with a bond strength corresponding to a fullerene desorption temperature from the monolayer of at least about 700K.

20. The article of claim 16, wherein the fullerene comprises $C_{60}$.

21. The article of claim 16, wherein the article is a head and wherein the magnetic material is located at a surface of the head.

22. The article of claim 21, wherein the magnetic material forms a transducer and wherein the magnetic material comprises cobalt or a cobalt alloy.

23. The article of claim 21, wherein the head has an air bearing surface and the fullerene molecules are bonded over the entire air bearing surface.

24. The article of claim 21, wherein fullerene molecules are only bonded to the magnetic material along the air bearing surface.

25. The article of claim 16, wherein the article is a magnetic disc and wherein the magnetic material is located at a surface of the magnetic disc.

26. The article of claim 25, wherein the disc surface is patterned.

27. The article of claim 25, wherein the approximate monolayer of fullerene covers a portion of the disc surface.

28. The article of claim 16, wherein the article comprises a head and a magnetic disc, wherein the magnetic material is located at a surface of the head and wherein a second magnetic material is located at a surface of the magnetic disc.

29. The article of claim 16, wherein the coating surface is substantially free of oxides.

* * * * *